US009244105B2

(12) United States Patent
Aubin et al.

(10) Patent No.: US 9,244,105 B2
(45) Date of Patent: Jan. 26, 2016

(54) PORTABLE SPHERICAL NEAR-FIELD ANTENNA MEASUREMENT SYSTEM

(71) Applicant: ORBIT Advanced Technologies, Inc., Horsham, PA (US)

(72) Inventors: John F. Aubin, New Britain, PA (US); Per Olav Iversen, Doylestown, PA (US); Edmund Lee, Wyncote, PA (US); Brian C. Jackson, Quakertown, PA (US); Russell Jay Soerens, Perkasie, PA (US); Edward Szpindor, Bow, NH (US); Vincent Keenan, Gilbertsville, PA (US)

(73) Assignee: ORBIT Advanced Technologies, Inc., Horsham, PA (US)

( * ) Notice: Subject to any disclaimer, the term of this patent is extended or adjusted under 35 U.S.C. 154(b) by 0 days.

(21) Appl. No.: 14/433,101

(22) PCT Filed: Feb. 27, 2014

(86) PCT No.: PCT/US2014/018823
§ 371 (c)(1),
(2) Date: Apr. 2, 2015

(87) PCT Pub. No.: WO2014/197017
PCT Pub. Date: Dec. 11, 2014

(65) Prior Publication Data
US 2015/0260772 A1    Sep. 17, 2015

Related U.S. Application Data

(60) Provisional application No. 61/830,886, filed on Jun. 4, 2013.

(51) Int. Cl.
*G01R 29/10* (2006.01)
*H01Q 3/00* (2006.01)
*H01Q 3/12* (2006.01)

(52) U.S. Cl.
CPC ............. *G01R 29/105* (2013.01); *G01R 29/10* (2013.01); *H01Q 3/12* (2013.01)

(58) Field of Classification Search
CPC ............................ G01R 29/105; G01R 29/10
USPC ......................................................... 343/703
See application file for complete search history.

(56) References Cited

U.S. PATENT DOCUMENTS 6,191,744 B1     2/2001  Snow et al.
6,329,953 B1 *  12/2001  McKivergan .......... G01R 29/10
                                                      343/703

(Continued)

FOREIGN PATENT DOCUMENTS

KR          10-0826527 B1     4/2008

*Primary Examiner* — Dameon E Levi
*Assistant Examiner* — Ricardo Magallanes
(74) *Attorney, Agent, or Firm* — Michael Crilly, Esquire

(57) ABSTRACT

A portable near-field measurement system for mapping radio frequency characteristics spherically about a test object is presented. The system includes an anechoic chamber, a rotatable annular platter, a rotatable platter, a stationary platform, and frequency converters. The chamber is an enclosure with an absorber material fastened to the interior thereof. The annular platter is disposed horizontally within the chamber and fastened to an azimuth positioner that rotates the annular platter about an azimuth rotation axis. The rotatable platter is disposed vertically within the chamber and rotatable about an elevation rotation axis via an elevation positioner. Azimuth and elevation axes intersect perpendicularly. A gantry arm with probe is fastened to and extends from the rotatable platter. A vertical arm is fastened between the annular platter and elevation positioner. Platters have front and back surfaces. A stationary platform is centered within the annular platter and attachable to a test column. Front surfaces are oriented toward the test column and covered with an absorber material. At least one frequency converter is fastened to the back surface of the rotatable platter and communicable with the probe. At least one other frequency converter is fastened to the stationary platform and communicable with a target.

23 Claims, 14 Drawing Sheets

(56) References Cited

U.S. PATENT DOCUMENTS

2011/0084887 A1  4/2011  Mow et al.
2011/0095950 A1  4/2011  Yu
2011/0121839 A1  5/2011  Gandois et al.

\* cited by examiner

PORTABLE SPHERICAL NEAR-FIELD ANTENNA MEASUREMENT SYSTEM

CROSS REFERENCE TO RELATED APPLICATIONS

This application is based upon and claims priority from Patent Cooperation Treaty Application No. PCT/US2014/018823 entitled Portable Spherical Near-Field Antenna Measurement System filed Feb. 27, 2014 which further claims priority from U.S. Provisional Application No. 61/830,886 filed Jun. 4, 2013 entitled Portable Spherical Near-Field Antenna Measurement System. The subject matters of the prior applications are incorporated in their entirety herein by reference thereto.

FEDERALLY SPONSORED RESEARCH AND DEVELOPMENT

None.

FIELD OF THE INVENTION

The invention generally relates to a portable antenna measurement system. Specifically, the system includes an anechoic chamber with elevation and azimuth rotational means which facilitate spherical near-field mapping of wireless communication components and small devices with wireless communication means operating at or above 50 Gigahertz (GHz). Exemplary devices include, but are not limited to, laptops, cellular telephones, digital pads, connectorized antennas, and chip/wafer antennas.

BACKGROUND

The evolution of portable electronic devices has entered a new phase, namely, connectivity via one or more wireless communication means. Laptops, digital pads, and other portable devices must now communicate wirelessly with intranets, internets, and other communication networks in a seamless fashion in order to fully exploit the capabilities of such portable devices and the software therein. Furthermore, the communicability of portable wireless devices is particularly desirable in the unlicensed bands above 60 Gigahertz.

The pursuit of wireless performance in ever smaller forms further complicates design, manufacture, and test of portable electronic devices and communication components used in such devices.

Portable wireless devices, like other electronic devices, are tested during development and manufacture and prior to sale. Testing is often limited to functionality, namely, turn ON verification and signal level measurement. Performance data is not collected, stored, processed, and visualized.

Unfortunately, present measurement systems including an anechoic chamber are neither portable nor capable of the data acquisition and pattern measurements required to verify the wireless communication performance of portable electronic devices, connectorized antennas, and chip/wafer antennas.

Therefore, what is required is a portable spherical near-field antenna measurement system including an anechoic chamber which is capable of data acquisition and pattern measurements so as to allow characterization of the wireless communication parameters of portable electronic devices and miniature antennas.

SUMMARY OF THE INVENTION

An object of the present invention is to provide a portable spherical near-field antenna measurement system including an anechoic chamber which is capable of data acquisition and pattern measurements so as to allow characterization of the wireless communication parameters of portable electronic devices and miniature antennas.

In accordance with embodiments of the invention, the portable near-field antenna measurement system includes an anechoic chamber, a rotatable annular platter, a rotatable platter, a stationary platform, and at least two frequency converters. The anechoic chamber is an enclosure with interior surfaces lined with absorbers. The rotatable annular platter is substantially horizontally disposed within the anechoic chamber. The rotatable annular platter includes an opening along an azimuth rotation axis. The rotatable annular platter is attached to an azimuth positioner that rotates the rotatable annular platter about the azimuth rotation axis. The rotatable platter is disposed substantially vertical within the anechoic chamber and is rotatable about an elevation rotation axis. The elevation rotation axis intersects and is substantially perpendicular to the azimuth rotation axis. A gantry arm is attached to and extends from the rotatable platter. A probe is attached to the gantry arm. The rotatable platter is attached to an elevation positioner that rotates the rotatable platter. A vertical arm is attached at a first end to the rotatable annular platter and at a second end to the elevation positioner. The rotatable annular platter and the rotatable platter each have a front surface and a back surface. A stationary platform is disposed within the opening and aligned with the rotatable annular platter. The stationary platform is attachable to a test column and the test column is attachable to a target. The front surfaces are oriented toward the test column and are covered with an absorber material. At least one frequency converter is attached to the back surface along the rotatable platter and communicable with the probe along the gantry arm. At least one other frequency converter is attached to the stationary platform opposite of the test column and communicable with the target In accordance with other embodiments of the invention, the test column is aligned along the azimuth rotation axis and the target is attachable to the test column so as to be substantially centered with respect to the azimuth and elevation rotation axes.

In accordance with other embodiments of the invention, the test column is offset from the azimuth rotation axis and the test column is attached to a test fixture which substantially centers the target with respect to the azimuth and elevation rotation axes.

In accordance with other embodiments of the invention, the test fixture includes a chip/wafer probe attached at one end thereof and the frequency converter is communicable with the target via the chip/wafer probe.

In accordance with other embodiments of the invention, the chip/wafer probe communicates with at least one frequency converter via a waveguide.

In accordance with other embodiments of the invention, the probe communicates with at least one frequency converter via a waveguide.

In accordance with other embodiments of the invention, the azimuth positioner includes a cavity along the azimuth rotation axis and an attachment element extends from the stationary platform and through the cavity to fix the stationary platform within the portable near-field antenna measurement system.

In accordance with other embodiments of the invention, the target is a laptop computer.

In accordance with other embodiments of the invention, the target is a cellular telephone.

In accordance with other embodiments of the invention, the target is a digital pad.

In accordance with other embodiments of the invention, the target is a connectorized antenna.

In accordance with other embodiments of the invention, the target is a wafer antenna.

In accordance with other embodiments of the invention, the target is a chip antenna.

In accordance with other embodiments of the invention, the anechoic chamber is mounted on a movable cart.

In accordance with other embodiments of the invention, a table extends from the cart.

In accordance with other embodiments of the invention, the table supports at least a portion of a computer communicable with the azimuth and elevation positioners.

In accordance with other embodiments of the invention, the frequency converters are communicable with an analyzer.

In accordance with other embodiments of the invention, the analyzer is communicable with a computer to acquire, process, store, and visualize date from the probe.

In accordance with other embodiments of the invention, the analyzer is communicable with a computer via a local area network (LAN) or a router.

In accordance with other embodiments of the invention, a positioner control unit is communicable with the azimuth and elevation positioners.

In accordance with other embodiments of the invention, the anechoic chamber is attached to a hardware rack with the analyzer, computer, and positioner control unit mounted to the hardware rack.

In accordance with other embodiments of the invention, at least one frequency converter is communicable with the analyzer via a switch box and an amplifier.

In accordance with other embodiments of the invention, the chamber includes a camera movable therein for use with connecting leads from a probe to a miniature antenna.

The dimensions of the measurement system are application dependent. In preferred embodiments, the measurement system is approximately seven-feet high by five-feet wide by five-feet long. The anechoic chamber is attached to a cart. The cart could include casters for portability. The chamber and cart could be constructed of a durable anodized extruded aluminum frame with coated side panels. The cart could be designed to roll on heavy duty low friction wheels for ease of movement. Analyzer and other electronics may be stowed within an equipment rack. A desk could extend from one side of the cart and support at least the peripheral elements of a computer, namely, a monitor, a keyboard, and a mouse. Other equipment for the system could be storable in the cart beneath the chamber.

The front end radio frequency (RF) components are mounted behind the rotatable platters within the anechoic chamber so as to minimize losses. Other components are attached to a gantry arm extending from one platter, thus enabling use of rigid waveguides between components.

Data acquisition and data processing is controlled and performed by software. In preferred embodiments, the 959Spectrum™ antenna measurement software facilitates data acquisition, analysis, and visualization. 959Spectrum™ is a trademark of Orbit FR, Inc. with its North American Headquarters located in Horsham, Pa. The software is applicable to both far-field and spherical near-field measurements. The software implements a Dynamic Density Control (DDC) methodology which enables the positioners to change velocity during data acquisition tasks. The DDC methodology facilitates collection of variable density data which significantly reduces test time.

A positioning subsystem includes a lightweight gantry arm assembly mounted to a rotatable elevation platter. A probe is mounted to the gantry arm and is manually rotatable to change polarization. The elevation platter is attached to a rotatable azimuth platter in a substantially perpendicular arrangement. The combination of two rotatable platters facilitates a full range of azimuths and elevations to map the electromagnetic properties within a sphere about a target. Both platters include a layer of absorber material to limit reflections which could otherwise adversely affect data collection.

A target, either a device-under test (DUT) or an antenna-under-test (AUT), is fixed to a low permittivity test column with or without a test fixture. The target is mechanically attached to the test column or fixture or held in place via a vacuum. Portable devices or connectorized antennas and the like are mounted on a column centered on the azimuth rotation axis. Chip or wafer antennas are mounted to a test fixture at one end of an offset test column whereby the test fixture centers the antenna with respect to the azimuth and elevation rotation axes.

Preferred embodiments of the portable measurement system include an RF subsystem featuring a vector network analyzer with millimeter wave converters for frequencies above 50 GHz. Mixers are generally not required below 50 GHz because of the close proximity of RF elements within the system.

A probe is mounted to a gantry arm attached to the elevation platter. The probe is positioned at an azimuth via the azimuth platter and then rotated about the target via the elevation platter. A spherical measurement zone is painted by repeating elevation measures along various azimuths about the target. The elevation and azimuth platters are separately attached to an equal number of positioners which rotate the platters in a controlled and precise manner. A turntable within the azimuth positioner supports the azimuth platter which further supports a vertical arm further attached to a positioner with elevation platter. An opening resides at the center of the azimuth platter and a stationary platform is located therein. The stationary platform is attached to a test column applicable to measurements of portable devices. This arrangement negates the need for rotary joints along otherwise rigid waveguide between electronic components.

The test column is composed of a dielectric material, one example being foam. A variety of test columns are attachable to the stationary platform to accommodate a variety of targets. In some embodiments, a test column could be attached to the stationary platform in an offset arrangement with respect to the azimuth rotation axis. The target is supported within a test fixture attached to the test column. In other embodiments, a test column could be attached to the stationary platform so that the end of the test column is adjacent to the intersection of rotation axes.

At least one frequency converter is attached to each platter. The frequency converter along the elevation platter is directly communicable with a probe along the gantry arm via a first waveguide and an analyzer in an equipment rack via a second waveguide. The frequency converter along the azimuth platter is directly communicable with a probe along the test fixture via a first waveguide and an analyzer in the equipment rack via a second waveguide. Communication between the frequency converters and analyzer could be through a coaxial cable with or without intermediate components. Connections between probes, frequency converters, and analyzer could be via coaxial cable below 50 GHz.

The measurement process is operable by a computer with control software, one non-limiting example being the 959Spectrum™ antenna measurement software, and graphical user interface which serves as an interface between positioners and RF instrumentation. The computer and control subsystem management include communication links facilitating acquisition, processing, visualization, and storage of data. Control equipment could include a controller integrated into or separate from each positioner. A positioner is directly attached to each platter, thus enabling rotational movement of the platters and elements attached thereto.

Chip and other miniature antennas are problematic in that electrical contacts are extremely small and therefore difficult to see and properly complete with the contacts along a probe. In these applications, it might be desirable to include a camera system within the anechoic chamber.

An optional visualization system for chip antenna testing is mounted to a rotatable mast rotatably attached within the chamber structure. A camera enables imaging of a miniature antenna chip to ensure electrical contact between a probe and an antenna chip. The camera system includes a motorized remote focus and zoom. The image is displayed on a monitor outside of the anechoic chamber for live viewing to enable attachment of electrical connections between probe and antenna leads.

Several advantages are offered by the invention. The invention facilitates accurate data acquisition and pattern measurements for a wireless communication device within a laptop or other portable electronic device, a connectorized antenna, or a wafer or chip antenna. The invention facilitates a nearly complete spherical mapping of the wireless communication characteristics of portable devices and miniature antennas. The invention includes an offset dual-axis spherical scanning system that allows optimum implementation of an RF probe and optimum location of frequency converters relative to a target, while minimizing losses and reflections and optimizing the electromagnetic environment within the anechoic chamber. The portability of the invention facilitates quicker scan times and lower operational costs. The invention is applicable to mapping the performance characteristics of ultra-high frequency radar.

The above and other objectives, features, and advantages of the preferred embodiments of the invention will become apparent from the following description read in connection with the accompanying drawings, in which like reference numerals designate the same or similar elements.

BRIEF DESCRIPTION OF THE DRAWINGS

Additional aspects, features, and advantages of the invention will be understood and will become more readily apparent when the invention is considered in the light of the following description made in conjunction with the accompanying drawings.

DETAILED DESCRIPTION OF THE INVENTION

Figure 1:
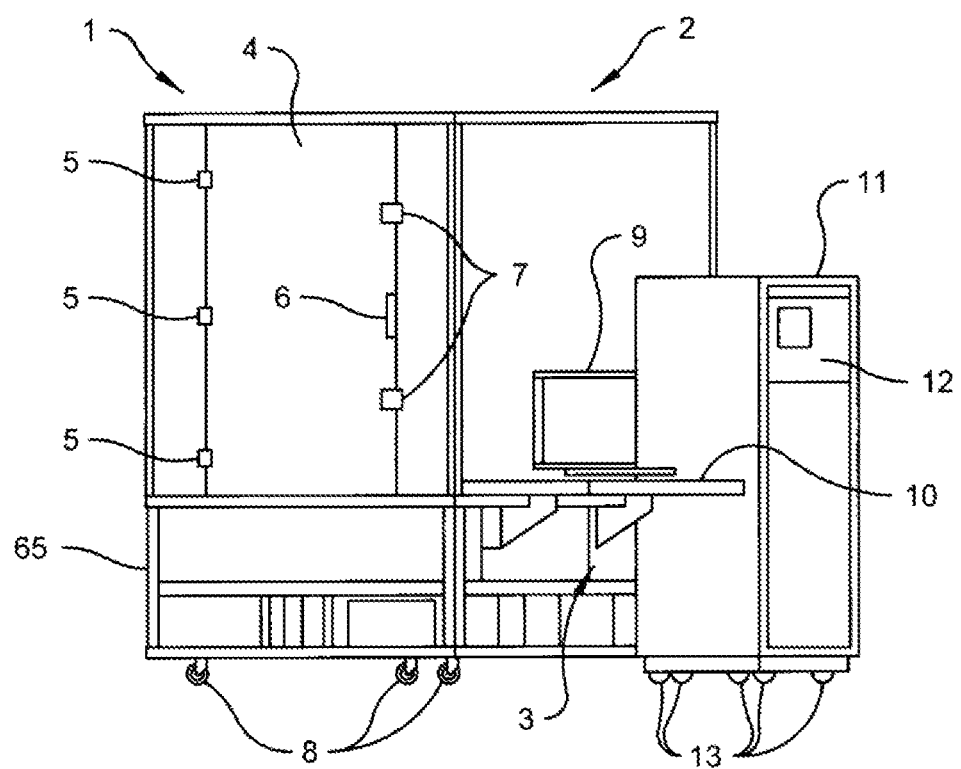
FIG. 1 is a corner elevation view illustrating a portable measurement system in accordance with an embodiment of the invention.

Reference will now be made in detail to several preferred embodiments of the invention that are illustrated in the accompanying drawings. Wherever possible, same or similar reference numerals are used in the drawings and the description to refer to the same or like parts. The drawings are not to precise scale. While features of various embodiments are separately described throughout this document, it is understood that two or more such features could be combined into a single embodiment.

While reference is made herein to components by generic identifiers, examples including but not limited to a computer 10, an analyzer 12, a probe 20, an elevation positioner 28, a frequency converter 29, an azimuth positioner 37, a chip/wafer probe 39, a chip/wafer probe adjustment 40, a frequency converter 45, a chip/wafer probe contact assembly 51, a positioner control unit 67, a switch box 68, an amplifier 69, and a router 70, it is understood that components are commercially available items and that the generic identifiers for these and other components are not intended to limit the scope, function, or performance of the invention or of the individual components therein.

Referring now to FIG. 1, a portable measurement system 1 is shown including an anechoic chamber 2. The anechoic chamber 2 is a multi-side enclosure of general construction understood in the art. For example, the anechoic chamber 2 could be composed of lightweight panels arranged and attached to form a box-shaped structure with a door 4. The door 4 could include one or more hinges 5 attached along one edge thereof and at another end to one panel within an opening along the anechoic chamber 2. A handle 6 could be attached to the door 4 to facilitate opening and closing. One or more locks 7 could be attached along one edge of the door 4 and interact with hardware along a panel of the anechoic chamber 2 so as to further secure the door 4 to the anechoic chamber 2 when closed.

The anechoic chamber 2 could contact and be mechanically attached or fixed to a cart 65. The cart 65 could be composed of beam-like elements and/or panels arranged to form a lightweight structure sufficiently capable of supporting the anechoic chamber 2 in an upright arrangement. The cart 65 could include casters 8 disposed along the cart 65 opposite of the anechoic chamber 2. Each caster 8 could include a rotatable low-friction wheel which allows the anechoic chamber 2 and cart 65 to move along a support surface, one example being a floor.

A workstation 3 could be provided along one side of the anechoic chamber 2. In one example, a table 10 could be fixed to the anechoic chamber 2 and extend therefrom. The table 10 could support at least one peripheral device of a computer 9, examples including mouse, display, and/or keyboard.

An equipment rack 11 could reside along one side of the anechoic chamber 2 and could be mechanically attached or fixed to the anechoic chamber 2 or cart 65. The equipment rack 11 could also include casters 13 each including a rotatable low-friction wheel. The equipment rack 11 could include one or more bays facilitating storage of equipment for the portable measurement system 1. In one example, an analyzer 12 could reside within a bay along the equipment rack 11.

Figure 2:
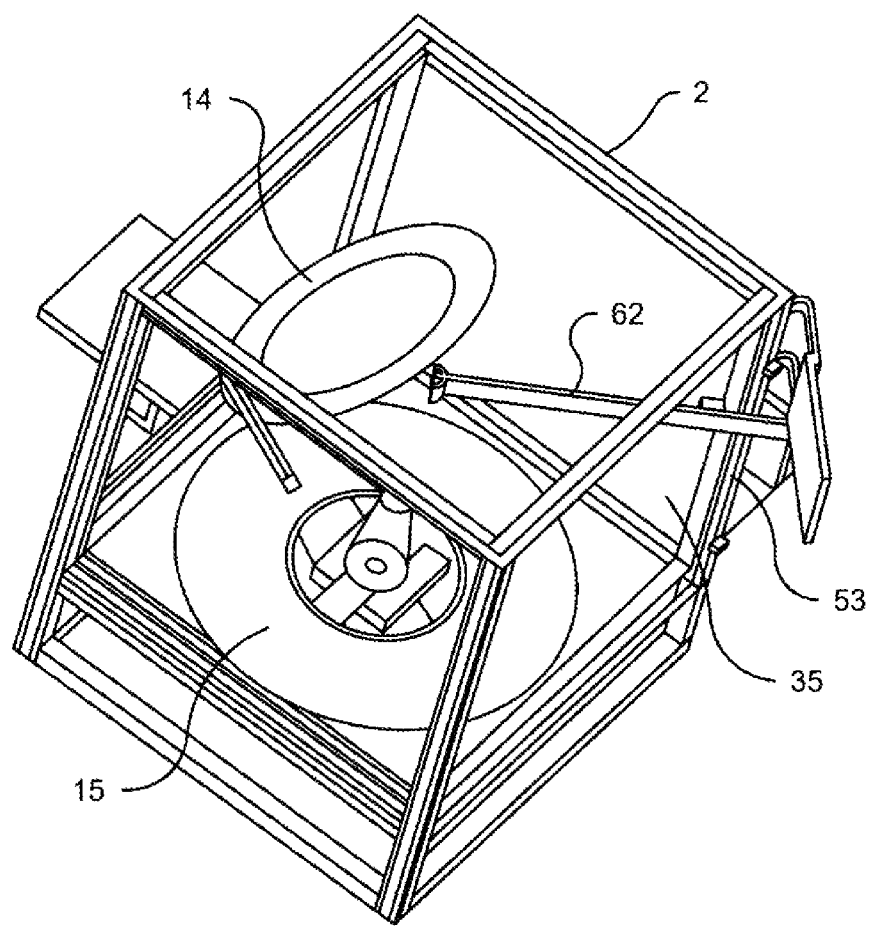
FIG. 2 is a top perspective view through top and side panels of a portable measurement system illustrating elevation and azimuth assemblies within an anechoic chamber in accordance with an embodiment of the invention.

Referring now to FIG. 2, an azimuth assembly 15 and an elevation assembly 14 are shown disposed within the anechoic chamber 2. The top and side walls are not illustrated so that the azimuth assembly 15 and elevation assembly are viewable. The azimuth assembly 15 is a generally circular structure oriented horizontally within and biased toward the lower end of the anechoic chamber 2. The elevation assembly 14 is a generally circular structure oriented vertically within the anechoic chamber 2. The elevation assembly 14 is positioned along and is attached to the azimuth assembly 15. The elevation assembly 14 extends above the azimuth assembly 15 to form a substantially perpendicular structure within the interior of the anechoic chamber 2 whereby the elevation assembly 14 rotates with the azimuth assembly 15 along a horizontal plane. The elevation assembly 14 is further rotatable along a vertical plane.

The interior surfaces 35 of the anechoic chamber 2 are covered with an absorber material (not shown). In general, the absorber material absorbs and dissipates radio frequency (RF) energy which impinges the walls of the anechoic chamber 2 so as to minimize reflections that could adversely affect measurements around a test item. Absorber material could include, but are not limited to, foam or a combination of ferrite and foam fabricated via methods understood in the art. The absorber material is shaped to form elements. Non-limiting examples of absorber elements are described by Smith in U.S. Pat. No. 3,100,870 entitled Rooms for Testing Electronic Equipment issued Aug. 13, 1963, Buckley in U.S. Pat. Nos. 3,113,271 and 3,120,641 entitled Microwave Anechoic Chamber issued Dec. 3, 1963 and Feb. 4, 1964, respectively, Hemming in U.S. Pat. No. 4,507,660 entitled Anechoic Chamber issued Mar. 26, 1985, Shibuya in U.S. Pat. No. 4,906,998 entitled Radio-Frequency Anechoic Chamber issued Mar. 6, 1990, Kogo in U.S. Pat. No. 4,931,798 entitled Electromagnetic Anechoic Chamber with an Inner Electromagnetic Wave Reflection Surface and an Electromagnetic Wave Absorption Small Ball Disposed in the Chamber issued Jun. 5, 1990, Sanchez in U.S. Pat. No. 5,631,661 entitled Geometrically Optimized Anechoic Chamber issued May 20, 1997, Berg et al. in U.S. Pat. No. 6,008,753 entitled Low Radar Cross-Section (RCS) Measurement Chamber and Associated Measurement System issued Dec. 28, 1999, and Winebrand et al. in U.S. Pat. No. 7,940,204 entitled Absorber Assembly for an Anechoic Chamber issued May 10, 2011.

Figure 3:
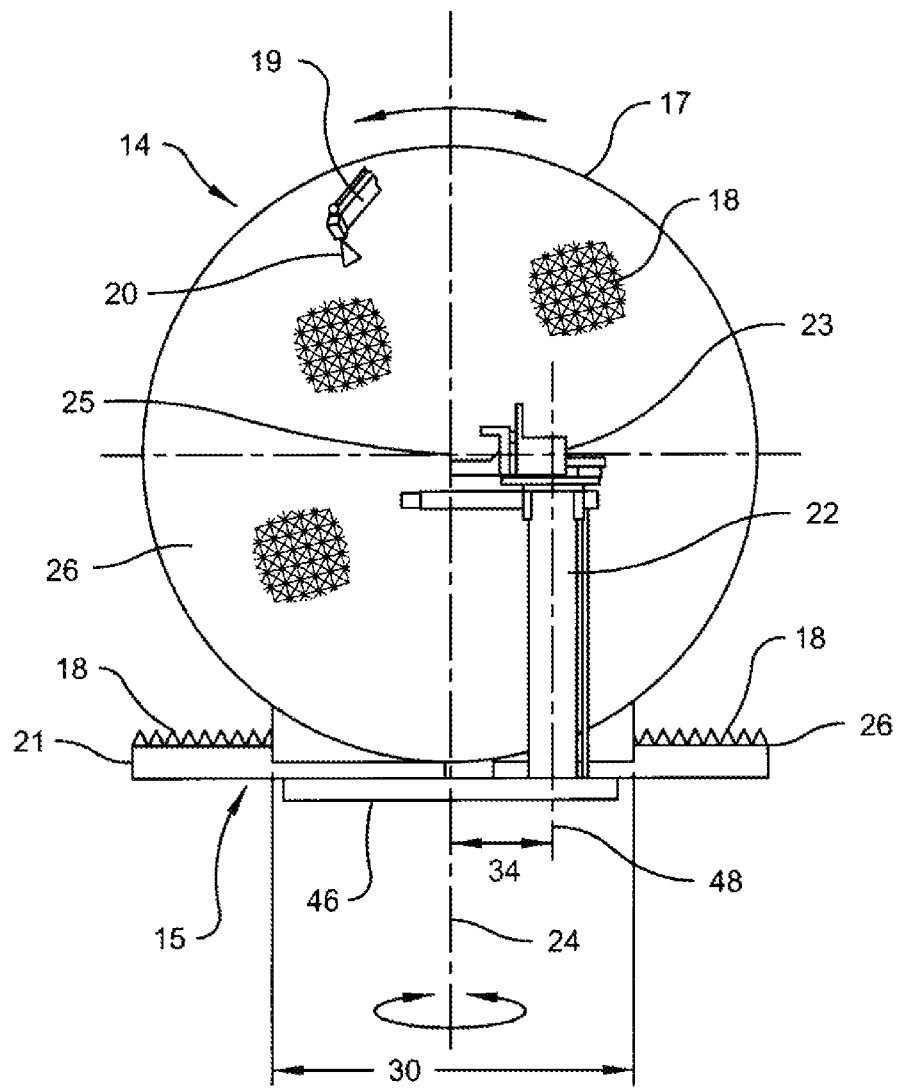
FIG. 3 is a side elevation view illustrating features of elevation and azimuth assemblies and an offset test column in accordance with an embodiment of the invention.

Referring now to FIG. 3, the elevation assembly 14 includes a rotatable platter 17 of generally circular construction. The rotatable platter 17 is vertically disposed in an upright arrangement. The rotatable platter 17 is generally a planar-shaped element composed of a metal or a non-metallic material, one example of the latter being a plastic. The rotatable platter 17 is rotatable about an elevation rotation axis 25 which extends generally perpendicularly from the planar-shaped rotatable platter 17.

The front surface 26 along the rotatable platter 17 is covered with a plurality of absorber elements 18 each composed of an absorber material as described for the anechoic chamber 2. Although the absorber elements 18 are shown within three distinct groups along the front surface 26 in FIG. 3, it is understood that the absorber elements 18 at least substantially and continuously cover the front surface 26. Each absorber element 18 is shaped to minimize RF reflections from the rotatable platter 17. While pyramidal-shaped absorber elements 18 are represented in FIG. 3, it is understood that other shapes are possible. The absorber elements 18 are attached to the front surface 26 of the rotatable platter 17 via methods understood in the art. The absorber elements 18 minimize reflection of RF energy from the elevation assembly 14.

A gantry arm 19 is mechanically attached to the rotatable platter 17, preferably toward the outer diameter thereof. The gantry arm 19 is a beam-shaped element fabricated from a dielectric material, one example being foam, or a non-dielectric material and covered with absorber material. The gantry arm 19 could be fastened to the rotatable platter 17 via a bolt or screw which engages a hole through the rotatable platter 17 and penetrates a like-sized cavity with complementary threading extending from one end into the gantry arm 19.

A probe 20 is mechanically secured via techniques understood in the art to the free end of the gantry arm 19. The probe 20 is capable of sending and/or receiving RF signals to/from a device-under-test (DUT) or an antenna-under-test (AUT), otherwise referred to herein as a target 36 (not shown in FIG. 3).

The azimuth assembly 15 includes a rotatable annular platter 21 of generally circular shape. The rotatable annular platter 21 is horizontally disposed immediately below the elevation assembly 14. The rotatable annular platter 21 is rotatable about an azimuth rotation axis 24 which extends generally perpendicular to the planar-shaped rotatable annular platter 21. The azimuth rotation axis 24 intersects the elevation rotation axis 25 in a substantially perpendicular arrangement, as generally represented in FIG. 3. The probe 20 is generally aligned with the intersection of the azimuth and elevation rotation axes 24, 25.

The rotatable annular platter 21 is generally a planar-shaped element composed of a metal or a non-metallic material, one example of the latter being a plastic. The front surface 26 along the rotatable annular platter 21 is covered with a plurality of absorber elements 18, each composed of an absorber material as described for the anechoic chamber 2. Each absorber element 18 is shaped to minimize RF reflections from the rotatable annular platter 21. While pyramidal-shaped absorber elements 18 are represented in FIG. 3, it is understood that other shapes are possible. The absorber elements 18 are attached to the front surface 26 via methods understood in the art. The absorber elements 18 minimize reflection of RF energy from the azimuth assembly 15.

Figure 4:
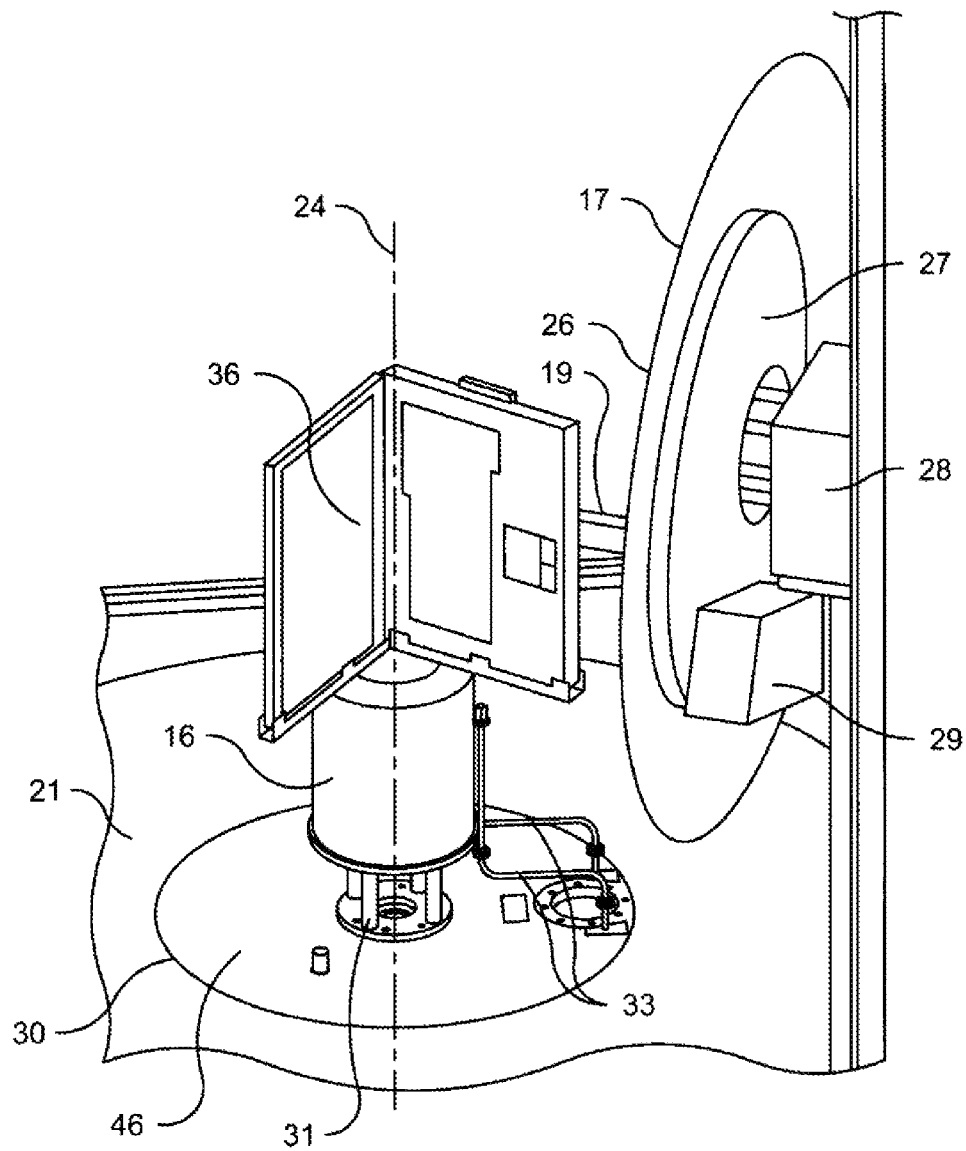
FIG. 4 is an enlarged top perspective view illustrating a center-mounted test column attached to a stationary platform surrounded by a horizontally disposed rotatable annular platter and adjacent to a vertically disposed elevation platter in accordance with an embodiment of the invention.
Figure 5:
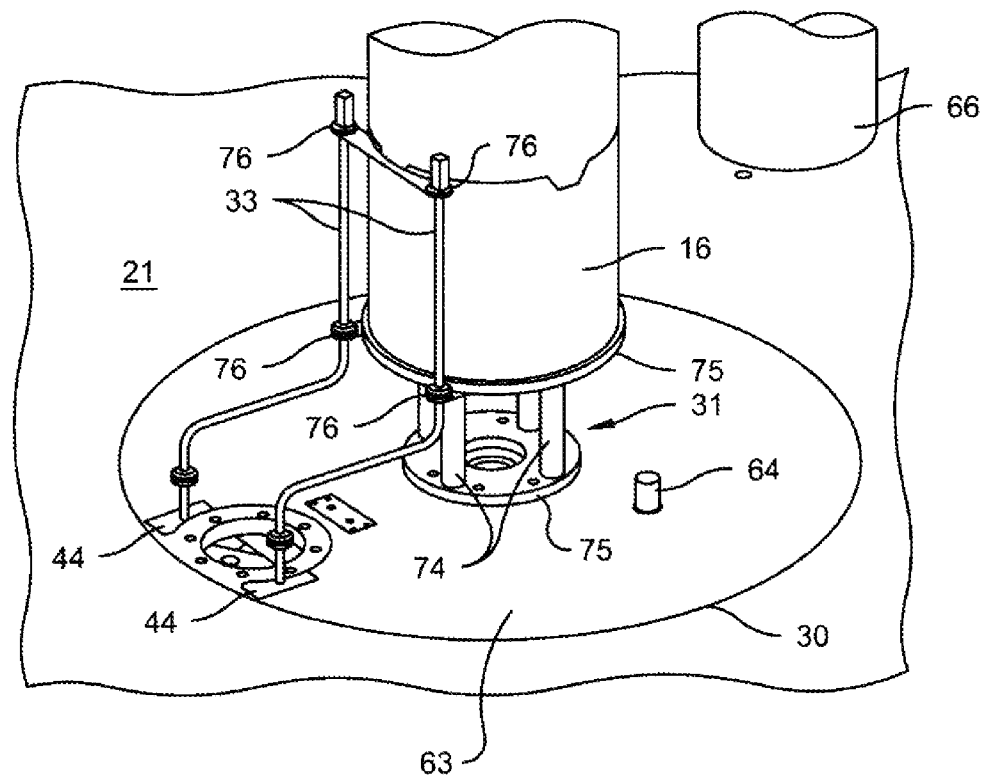
FIG. 5 is an enlarged top perspective view illustrating an absorber panel within an opening through a rotatable annular platter and waveguides passing through the absorber panel and a stationary platform (not shown) below the absorber panel in accordance with an embodiment of the invention.

Referring now to FIGS. 4 and 5, the rotatable annular platter 21 includes a circular-shaped opening 30. The opening 30 is substantially centered about the azimuth rotation axis 24. A like-shaped absorber element 63 is positioned over the opening 30 so as to contact a stationary platform 46 centered with the opening 30. The absorber element 63 could include holes to accommodate the test column 16 or the test column 22 (not shown). A cylindrically-shaped test column 16 could be mechanically attached to the stationary platform 46 via mounting hardware 31. In one example, the mounting hardware 31 could include one or more bolt-shaped elements 74 which traverse and attach to a pair of spaced washer-like elements 75. The bolt-shaped elements 74 could extend through the washer-like elements 75 so as to allow for attachment to complementary shaped cavities extending into the test column 16 and azimuth assembly 15, preferably mounting to the latter via the stationary platform 46. The mounting hardware 31 could be composed of a dielectric material or a non-dielectric material with an absorber coating. In some embodiments, the test column 16 could be centered within the opening 30 so as to align with and along the azimuth rotation axis 24.

In other embodiments, a cylindrically-shaped test column 22 could be attached to the azimuth assembly 15 in an offset configuration, as represented in FIG. 3. Referring again to FIG. 3, the test column 22 is vertically aligned within the opening 30 and mechanically secured to a stationary platform 46 disposed below and parallel to the absorber element 63 and rotatable annular platter 21. In one example, a bolt or screw could engage a hole through the stationary platform 46 and penetrate a like-sized cavity with complementary threads extending into the test column 22. The test column 22 is fixed to the stationary platform 46 so that the column axis 48 along the center of the test column 22 is disposed at an offset 34 from the azimuth rotation axis 24. A test fixture 23 could be mechanically fastened to the upper end of the test column 22. The test fixture 23 could extend from or reside along the test column 22 so as to intersect the azimuth rotation axis 24 and elevation rotation axis 25.

Referring again to FIGS. 4 and 5, one or more waveguides 33 could extend through the stationary platform 46 and absorber element 63 for attachment to a target 36 via techniques understood in the art. The target 36 could be secured to the test column 16 also via techniques understood in the art. In some embodiments, the waveguide 33 could engage waveguide flanges 76 attached to the exterior of the test column 16 to secure the waveguide 33 to the test column 16. In other embodiments, each waveguide 33 could traverse a channel through the test column 16 so as to partially or completely conceal and shield the waveguide 33 within the test column 16. The waveguides 33 extending from the lower end of the test column 16 could be further mounted to the stationary structure 46 via a waveguide support 44. The waveguide 33 could be rigid elements, examples including but not limited to WR-10 and WR-15 sold by vendors within the art. It is understood that the waveguide 33 could refer to one or more such elements coupled to communicate RF signals between two points.

The absorber element 63 could include one or more optional holes which allow structure along or attached to the stationary platform 46 to extend there through. For example, an adjustment 64 along a frequency converter 29, 45 (not shown) could extend through the absorber element 63 thereby preventing relative rotational movement between the absorber element 63 and stationary platform 46 and further facilitating adjustment to the frequency converter 29, 45 without removal of the absorber element 63.

Figure 6:
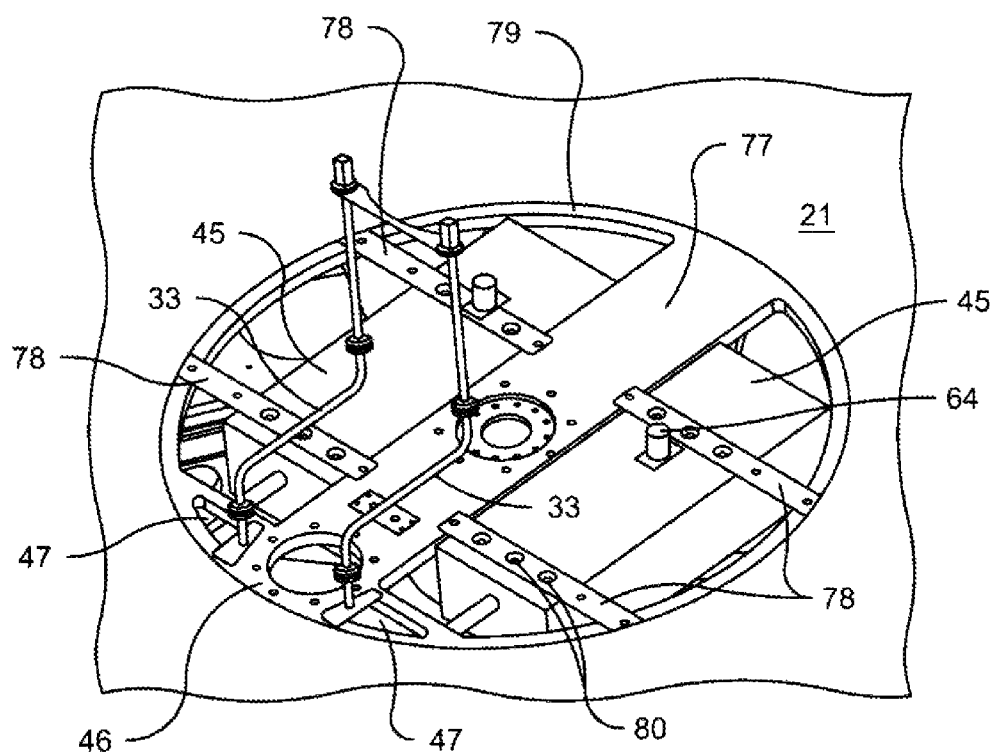
FIG. 6 is an enlarged top perspective view illustrating a stationary platform within an opening along a rotatable annular platter (absorber panel not shown) and waveguide passing through a pair of openings along the stationary platform in accordance with an embodiment of the invention.
Figure 7:
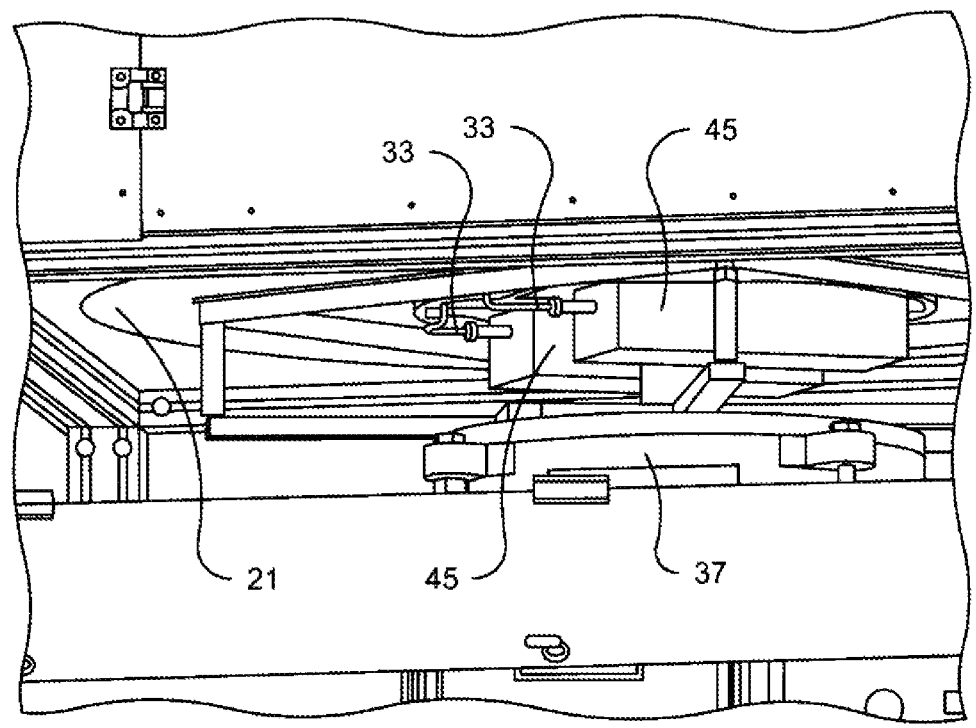
FIG. 7 is an enlarged bottom perspective view illustrating a pair of frequency converters attached to a stationary platform whereby each frequency converter is connected to one waveguide in accordance with an embodiment of the invention.

Referring now to FIGS. 6 and 7, the stationary platform 46 could be composed of one or more plates 77, 78 with or without perforations 80 mechanically fastened to or joined to a ring 79 adjacent to the rotatable annular platter 21. It is understood that the actual shape and design of the stationary platform 46 could differ from that in FIG. 6 based in part on the electronic components and other hardware comprising the portable measure system 1 and packaging thereof. One or more frequency converters 45 could be attached to the underside of the plates 78 via a mechanical fastener above or adjacent to the azimuth positioner 37. For example, a bolt or screw could engage a perforation 80 along a plate 78 and engage a cavity with complementary threads within the frequency converter 45 so as to secure and fix the frequency converter 45 to the plate 78. Each waveguide 33 could separately pass through openings 47 through the ring 79 and then mechanically couple to a frequency converter 45. The frequency converters 45 are positioned below the stationary platform 46 to shield them from RF signals.

Figure 8:
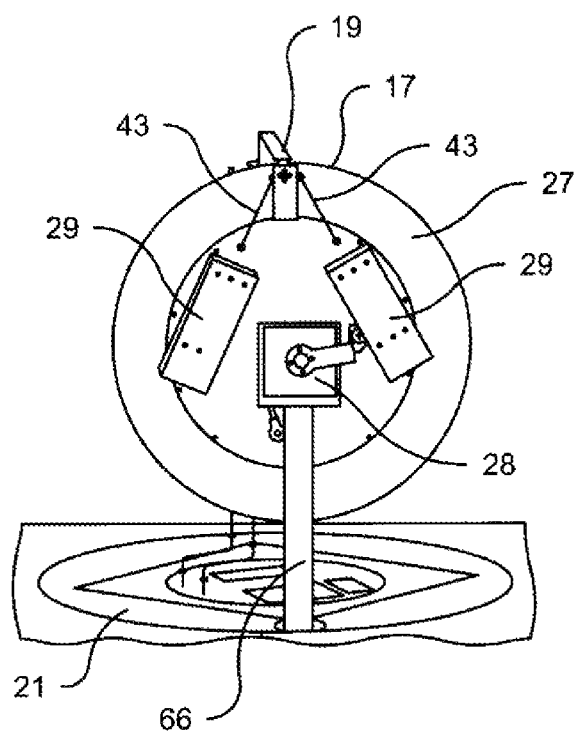
FIG. 8 is a side elevation view illustrating a vertical arm attached at one end to a rotatable annular platter and attached at another end to an elevation positioner with a rotatable platter attached thereto in accordance with an embodiment of the invention.

Referring now to FIG. 8 and again to FIG. 4, frequency converters 29 are shown contacting and attached to the back surface 27 of the rotatable platter 17. The frequency converters 29 are positioned along the back surface 27 to ensure the rotatable platter 17 completely shields the frequency converters 29 from RF signals. A waveguide 43 is mechanically attached to each frequency converter 29 and extends therefrom upward to the gantry arm 19. The waveguide 43 could be rigid elements, examples including commercially available items understood in the art. It is understood that the waveguide 43 could refer to one or more such elements coupled to communicate RF signals between two points.

The rotatable platter 17 is mechanically fastened to the elevation positioner 28 so as to facilitate rotation of the rotatable platter 17 by the elevation positioner 28. For example, two or more bolts or screws could separately engage holes through the rotatable platter 17 and further separately engage cavities with complementary threads within the housing of the elevation positioner 28 so as to secure and fix the rotatable platter 17 to the elevation positioner 28.

The elevation positioner 28 is further mechanically fastened to the upper end of a vertical arm 66. For example, a bolt or screw could engage a hole through the vertical arm 66 and engage a cavity with complementary threads within the housing of the elevation positioner 28 so as to secure and fix the elevation positioner 28 to the vertical arm 66. The rotatable platter 17 and frequency converters 29 positioned from the vertical arm 66 so as to avoid contact with the vertical arm 66 during rotation of the rotatable platter 17.

The lower end of the vertical arm 66 is mechanically fastened to the rotatable annular platter 21. For example, a bolt or screw could engage a hole through the rotatable annular platter 21 and thereafter engage a cavity with complementary threads within the vertical arm 66 so as to secure and fix the vertical arm 66 to the rotatable annular platter 21. It is preferred for the vertical arm 66 to be positioned toward the outer diameter of the rotatable annular platter 21.

The vertical arm 66 could be a cylindrically-shaped element composed of a dielectric material or a non-dielectric material covered with an absorber material. The vertical arm 66 should be sufficiently long so as to allow the rotatable platter 17 to freely rotate about the rotatable annular platter 21 without contact. In some embodiments, it might be advantageous to minimize the separation between the outer diameter of the rotatable platter 17 and the surface of the rotatable annular platter 21 so as to minimize RF reflections from the vertical arm 66.

Figure 9:
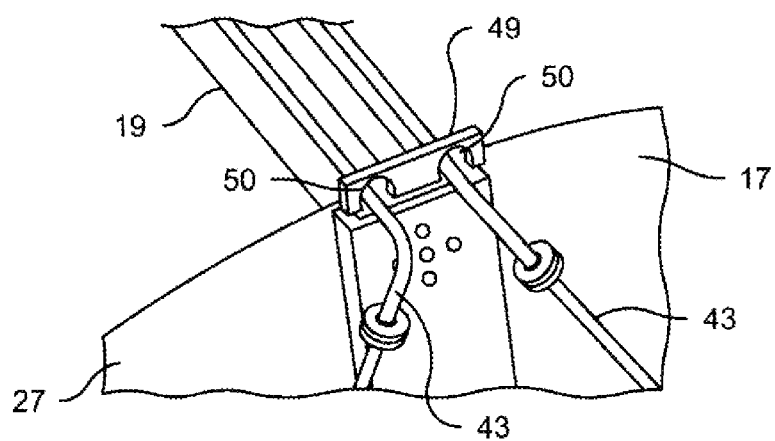
FIG. 9 is an enlarged perspective view illustrating waveguides disposed along a rotatable platter and a gantry arm attached to the rotatable platter in accordance with an embodiment of the invention.

Referring now to FIG. 9, the waveguides 43 extend radially outward along back surface 27 of the rotatable platter 17. Each waveguide 43 passes through an opening 50 along a support 49 attached to the rotatable platter 17 immediately adjacent to the outer diameter. The waveguides 43 then traverse the gantry arm 19 and are mechanically coupled to the probe 20 (not shown). The waveguides 43 are positioned along the top of the gantry arm 19 so as to minimize the possibility of RF reflections from the waveguides 43.

Figure 10:
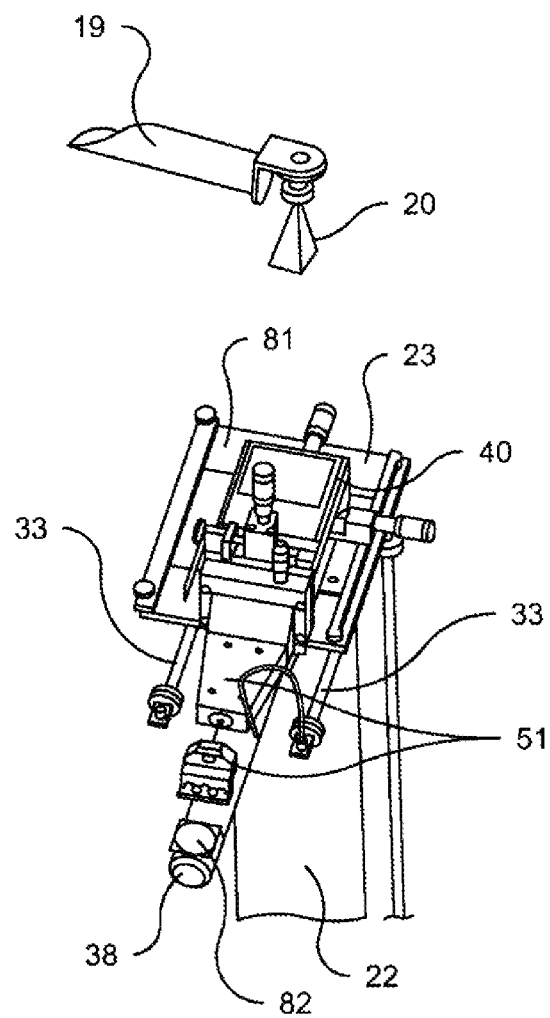
FIG. 10 is an enlarged perspective view illustrating a test fixture attached at one end of an offset test column and extending therefrom for the offset support of a chip antenna target in accordance with an embodiment of the invention.
Figure 11:
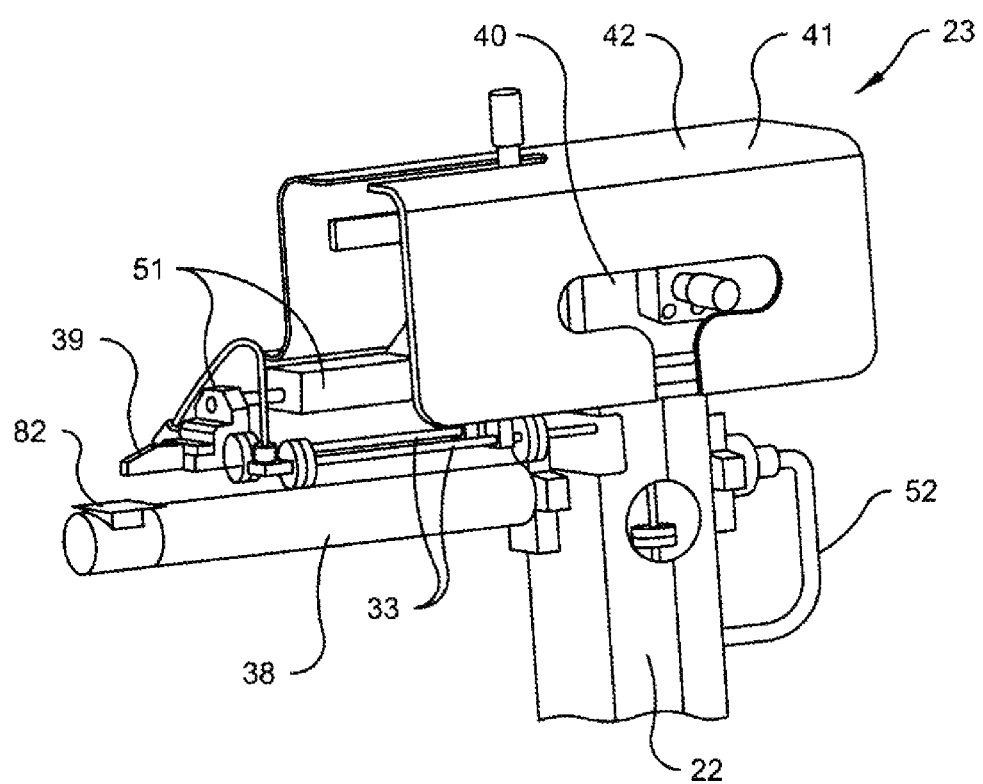
FIG. 11 is an enlarged perspective view illustrating arrangement of a chip/wafer probe adjustment, chip/wafer probe contact assembly, and chip/wafer probe along a test fixture attached at one end to an offset test column and supporting a target at another end in accordance with an embodiment of the invention.

Referring now to FIGS. 10 and 11, the test fixture 23 is attached at the upper end of a test column 22. In an exemplary embodiment, the test fixture 23 could include a planar disposed platform 81 attached to an arm 38 which extends from one end thereof. Both platform 81 and arm 38 are horizontally disposed so as to intersect the vertical arm 22 in a substantially perpendicular arrangement. The platform 81 and arm 38 could be composed of a dielectric material or a non-dielectric material covered with an RF absorber. A chip/wafer probe adjustment 40 is attached to the platform 81. A chip/wafer probe contact assembly 51 is attached at one end of the chip/wafer probe adjustment 40 and extends therefrom in the direction of and parallel to the arm 38. A chip/wafer probe 39 is attached to the distal end of the chip/wafer probe contact assembly 51 so as to further extend toward a pad 82 along the distal end of the arm 38. The chip/wafer probe 39 is generally aligned with the rotatable platter 17 along the elevation rotation axis 25. A target 36 (not shown) is placed onto the pad 82 and secured thereto via techniques understood in the art and then electrically connected to the probe 39. The chip/wafer probe adjustment 40 is preferred to include multi-axis adjustability so as to facilitate alignment of contacts along the chip/wafer probe 39 with contacts along a target 36, one example of the latter being a chip antenna. The chip/wafer probe 39 is also electrically connected to the waveguide 33. The waveguide 33 traverses the arm 38 and vertical arm 22 either externally or internally through one or more channels, the latter arrangement further minimizing reflections within the anechoic chamber 2. The chip/wafer probe 39 could also be electrically connected to one or more transmission lines 52, examples including but not limited to waveguide or coax cable, disposed along or traversing through the vertical arm 22. The chip/wafer probe adjustment 40 and a portion of the chip/wafer probe contact assembly 51 could be covered by a removable shroud 41 composed of a dielectric material or a non-dielectric material with absorber material applied to the exterior 42 thereof.

The test fixture 23 is positioned at the top of the vertical arm 22 in a cantilevered arrangement. The arm 38 is oriented so that the pad 82 and target 36 thereon are positioned so to at least partially intersect the azimuth rotation axis 24. In preferred embodiments, the pad 82 is positioned so that the pad 82 and target 36 thereon (latter not shown) intersect both the azimuth rotation axis 24 and the elevation rotation axis 25. The probe 20 is positioned by the gantry arm 19 so as to be substantially aligned with the target 36 along the pad 82.

Figure 12:
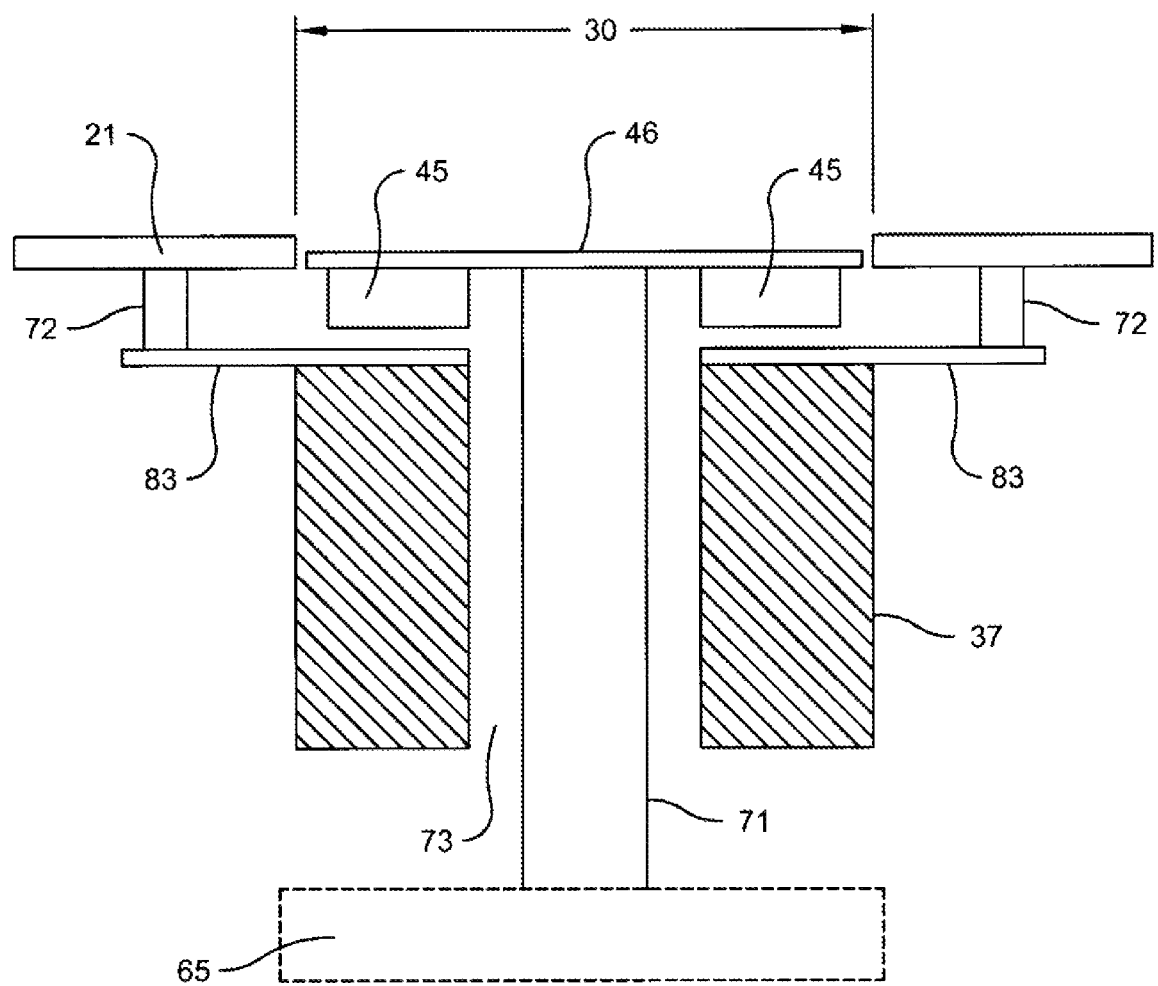
FIG. 12 is a cross-section view illustrating attachment of a stationary platform to a cart through a central cavity along an azimuth positioner whereby the azimuth positioner is fastened to a rotatable annular platter in accordance with an embodiment of the invention.

Referring now to FIG. 12, the azimuth positioner 37 could include an annular form with a cavity 73 there through. The stationary platform 46 could be attached at one end to a vertically disposed arm 71. The arm 71 could extend downward from the stationary platform 46 in the direction of the azimuth positioner 37 and through the cavity 73 therein. The lower end of the arm 71 could be attached to structural elements within the cart 65 so as to fix the stationary platform 46 and frequency converters 45 attached thereto to the cart 65. The arm 71 could be sufficiently long so as to generally align the stationary platform 46 within the opening 30 through the rotatable annular platter 21. The opening 30 should be sufficiently large to prevent contact between the inner diameter of the rotatable annular platter 21 and outer diameter of the stationary platform 46.

At least two arms 83 could be attached to the azimuth positioner 37 so as to be rotatable thereby. The arms 83 could extend radially outward from the azimuth positioner 37 toward the outer diameter of the rotatable annular platter 21. Each arm 71 could be attached to the rotatable annular platter 21 via a spacer 72. The spacer 72 is mechanically fixed at one end to the rotatable annular platter 21 and at another end to an arm 83. The spacer 72 separates the rotatable annular platter 21 from the arm 71 thereby providing sufficient space for the frequency converters 45 mounted to the bottom surface of the stationary platform 46.

Figure 13:
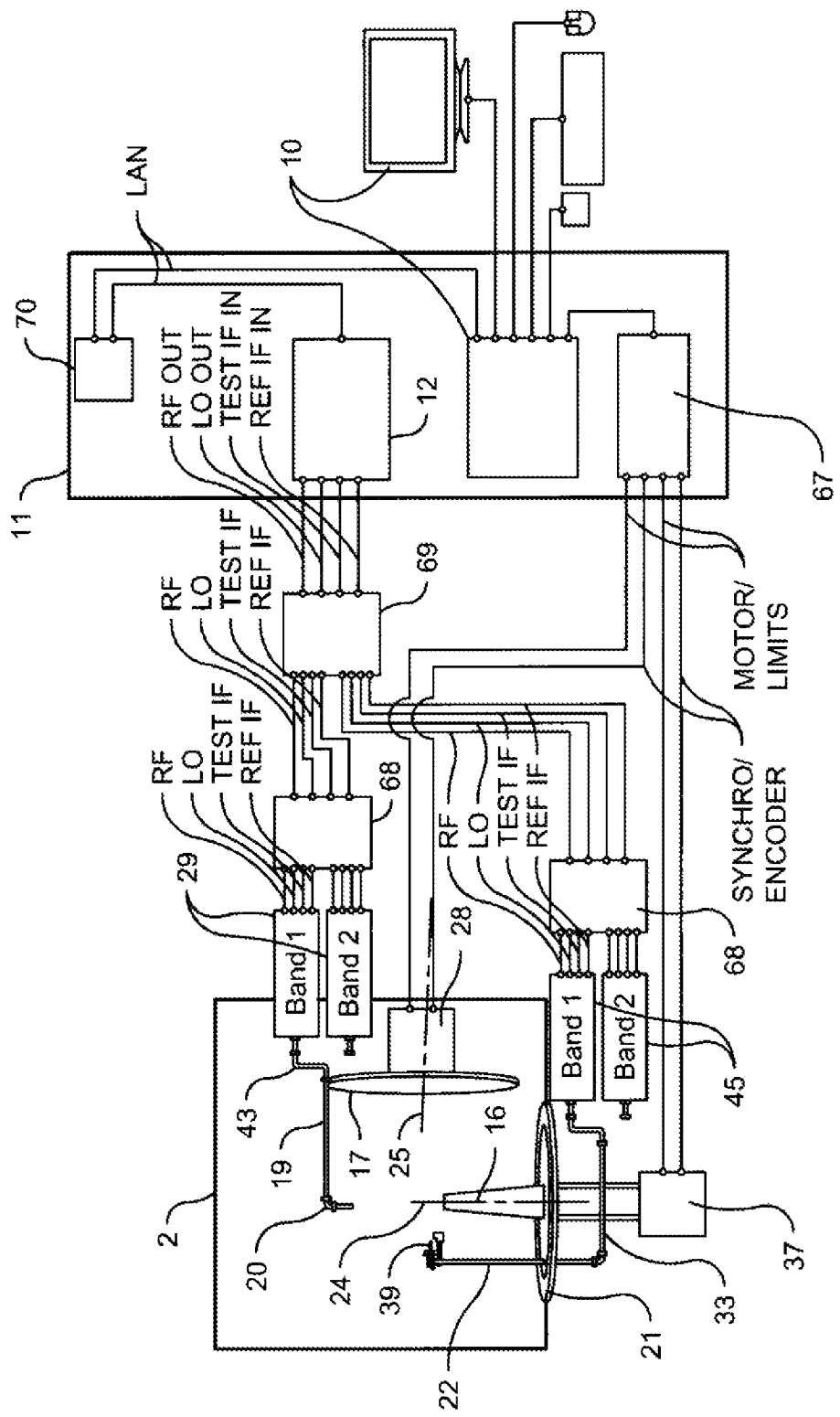
FIG. 13 is a schematic diagram illustrating connectivity between components within a portable measurement system in accordance with an embodiment of the invention.

Referring now to FIG. 13, the probe 20 transmits and/or receives RF signals from a target 36 (not shown) attached to a test column 16, 22. The target 36 is controlled via techniques understood in the art to send and/or receive RF signals exemplary of the data required to characterize performance. In receiving mode, the probe 20 communicates an RF signal to at least one frequency converter 29 via a waveguide 43. In some embodiments, two frequency converters 29 may be provided whereby each frequency converter 29 is applicable to a particular band. The waveguide 43 may be attached to one frequency converter 29 for the band tested, as represented in FIG. 13. Unless otherwise specified, communication between RF equipment is via coaxial cable or other suitable cabling. Waveguide, cabling and other conduits are positioned to at least minimize RF reflections. For example, connections to and from frequency converters 29 could be concealed along the back surface of the rotatable platter 17 and rotatable annular platter 21. The frequency converter 29 receives the RF signal and up-converts or down-converts the frequency of the input signal. The frequency converter 29 then communicates the RF signal to a switch box 68 which takes the input signal and conditions the signal before sending it to an amplifier 69. In transmitting mode, the process is reversed and the RF signal travels from the amplifier 69 to the probe 20.

Referring again to FIG. 13, the chip/wafer probe 39 transmits and/or receives an RF signal from the target 36 (not shown) attached to a test column 22. The target 36 is positioned on the test column 22 so as to be substantially aligned with the azimuth and elevation rotation axes 24, 25. The target 36 is controlled via techniques understood in the art to send and/or receive RF signals exemplary of the data required to characterize performance. The chip/wafer probe 39 communicates the RF signal to at least one frequency converter 45 via a waveguide 33. In some embodiments, two frequency converters 45 may be provided whereby each frequency converter 45 is applicable to a particular band. The waveguide 33 may be attached to one frequency converter 45 for the band tested, as represented in FIG. 13. The frequency converter 45 receives the RF signal and up-converts or down-converts the frequency of the input signal. The frequency converter 45 then communicates the RF signal to a switch box 68 which takes the input signal and conditions the signal before sending it to an amplifier 69. In transmitting mode, the process is reversed and the RF signal travels from the amplifier 69 to the chip/wafer probe 39.

The spacial location of the probe 20 relative to the target 36 is controlled via a positioner control unit 67. The positioner controller unit 67 is preferred to allow for 4-axis control. The positioner control unit 67 is communicable with the elevation positioner 28 and azimuth positioner 37. The positioner control unit 67 communicates control signals to the elevation positioner 28 to rotate the rotatable platter 17 about the elevation rotation axis 25 and to the azimuth positioner 37 to rotate the rotatable annular platter 21 about the azimuth rotation axis 24. The positioner control unit 67 receives data from the azimuth positioner 37 and elevation positioner 28 which allow for precise determination of the current position of the probe 20 relative to the target 36. Precise control of both azimuth and elevation enables a nearly complete spherical trace about the target 36 by the probe 20.

The amplifier 69 communicates RF signals to an analyzer 12 for processing via techniques understood in the art. The analyzer 12 could be a vector network analyzer. Data before and after processing is communicated to a computer 10, one example being a workstation. The analyzer 12 and computer 10 may be located within a hardware rack 11 and are communicable via wire or wireless communication means either directly or indirectly, one example of the latter being a router 70 over a local area network (LAN). The computer 10 enables data acquisition, storage, processing, and visualization. The computer 10 is also communicable with the positioner control unit 67 to facilitate control and command of the rotatable annular platter 21 and rotatable platter 17.

Figure 14:
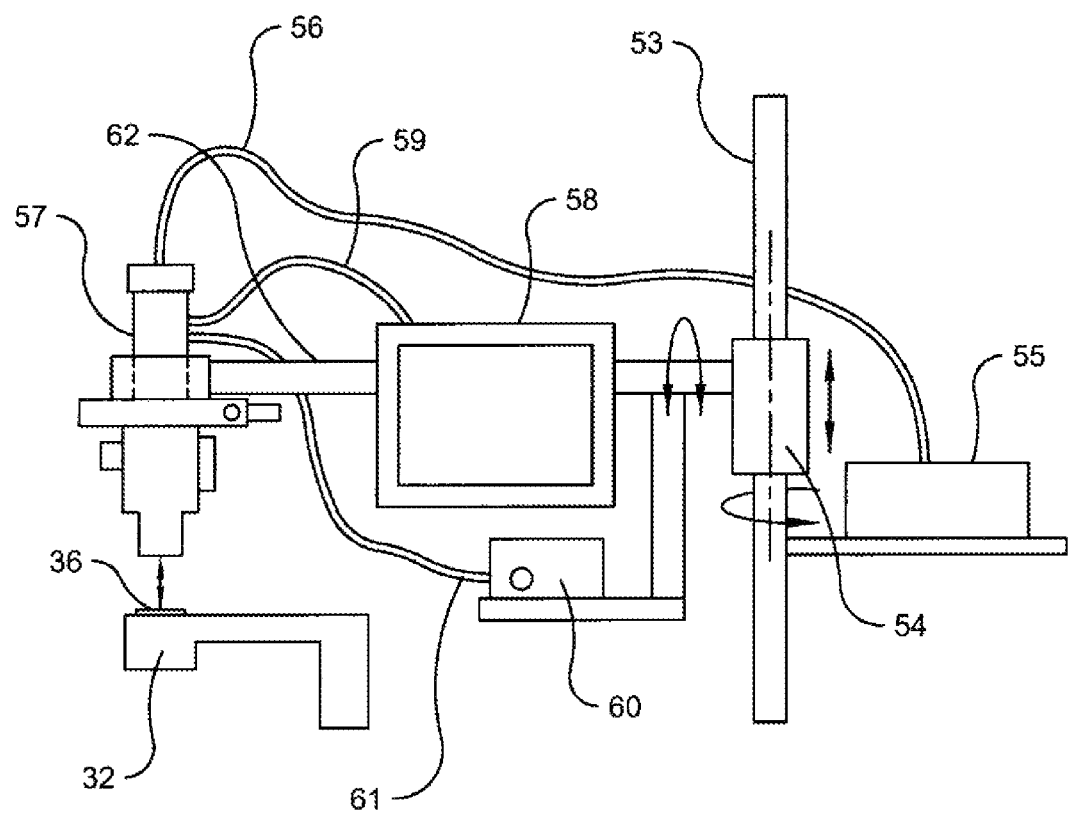
FIG. 14 is a schematic diagram illustrating a camera positioning system facilitating attachment of leads to a miniature antenna in accordance with an embodiment of the invention.

Referring now to FIG. 14 and again to FIG. 2, a mast 53 could be vertically disposed within one corner of an anechoic chamber 2. The mast 53 could communicate at one end to a motor or a manual adjustment enabling the mast 53 to rotate. A sleeve 54 could surround a portion of the mast 53 and move along the sleeve 54 via a second motor or a manual adjustment. An arm 62 could extend from the sleeve 54 and into the anechoic chamber 2 and communicate with a third motor or a manual adjustment enabling the arm 62 to rotate. The arm 62 may be removable from the anechoic chamber 2 prior to testing. A camera 57 with zoom lens could be attached to the free end of the arm 62. The camera 57 could include illuminated means communicated thereto from an illuminator 55 via a fiber optic cable 56. The camera 57 is positioned over a target 36 disposed along chuck 32. The chuck 32 could be a test fixture 23. The camera 57 and motors could be remotely controlled via a remote control unit 60 communicable with the camera 57 via a control signal cable 61. The viewable image from the camera 57 could be communicated to a display 58 via a video cable 59. The remote control unit 60 and display 59 could reside outside of the anechoic chamber 2 to minimize reflective surfaces therein.

As is evident from the explanation herein, the invention is a portable near-field measurement system, applicable to characterizing the RF properties within a sphere surrounding a portable device with wireless communication means or a wireless communication element, which minimizes reflections, losses, time, and costs associated with such measurements. Accordingly, the invention is expected to be applicable to a variety of portable chambers which collect data for electromagnetic compatibility, far-field antenna measurements and patterns, near-field measurements and patterns, or other such similar applications.

The description above indicates that a great degree of flexibility is offered in terms of the invention. Although various embodiments have been described in considerable detail with reference to certain preferred versions thereof, other versions are possible. Therefore, the spirit and scope of the appended claims should not be limited to the description of the preferred versions contained herein.

What is claimed is:

1. A portable near-field antenna measurement system comprising:
    (a) an anechoic chamber;
    (b) a rotatable annular platter disposed substantially horizontal within said anechoic chamber, said rotatable annular platter has an opening along an azimuth rotation axis, said rotatable annular platter attached to an azimuth positioner which rotates said rotatable annular platter about said azimuth rotation axis;
    (c) a rotatable platter disposed substantially vertical within said anechoic chamber, said rotatable platter attached to an elevation positioner which rotates said rotatable platter about an elevation rotation axis, said elevation rotation axis intersects and substantially perpendicular to said azimuth rotation axis, a gantry arm attached to and extends from said rotatable platter, a probe attached to said gantry arm, a vertical arm attached at a first end to said rotatable annular platter and at a second end to said elevation positioner, said rotatable annular platter and said rotatable platter each having a front surface and a back surface;
    (d) a stationary platform disposed within said opening and aligned with said rotatable annular platter, said stationary platform attachable to a test column, said test column attachable to a target, said front surfaces oriented toward said test column and covered with an absorber material; and
    (e) at least two frequency converters, at least one said frequency converter attached to said back surface along said rotatable platter and communicable with said probe, at least one other said frequency converter attached to said stationary platform opposite of said test column and communicable with said target.

2. The portable near-field antenna measurement system of claim 1, wherein said test column aligned along said azimuth rotation axis, said target attachable to said test column so as to be substantially centered with respect to said azimuth rotation axis and said elevation rotation axis.

3. The portable near-field antenna measurement system of claim 1, wherein said test column offset from said azimuth rotation axis, said test column attached to a test fixture which substantially centers said target with respect to said azimuth rotation axis and said elevation rotation axis.

4. The portable near-field antenna measurement system of claim 3, wherein said test fixture includes a chip/wafer probe attached at one end thereof and said frequency converter communicable with said target via said chip/wafer probe.

5. The portable near-field antenna measurement system of claim 4, wherein said chip/wafer probe communicates with at least one said frequency converter via a waveguide.

6. The portable near-field antenna measurement system of claim 1, wherein said probe communicates with at least one said frequency converter via a waveguide.

7. The portable near-field antenna measurement system of claim 1, wherein said azimuth positioner includes a cavity along said azimuth rotation axis, an attachment element extends from said stationary platform and through said cavity to fix said stationary platform within said portable near-field antenna measurement system.

8. The portable near-field antenna measurement system of claim 1, wherein said target is a laptop computer.

9. The portable near-field antenna measurement system of claim 1, wherein said target is a cellular telephone.

10. The portable near-field antenna measurement system of claim 1, wherein said target is a digital pad.

11. The portable near-field antenna measurement system of claim 1, wherein said target is a connectorized antenna.

12. The portable near-field antenna measurement system of claim 1, wherein said target is a wafer antenna.

13. The portable near-field antenna measurement system of claim 1, wherein said target is a chip antenna.

14. The portable near-field antenna measurement system of claim 1, wherein said anechoic chamber is mounted on a movable cart.

15. The portable near-field antenna measurement system of claim 14, wherein a table extends from said cart.

16. The portable near-field antenna measurement system of claim 15, wherein said table supports at least a portion of a computer communicable with said azimuth positioner and said elevation positioner.

17. The portable near-field antenna measurement system of claim 16, wherein said frequency converters are communicable with an analyzer.

18. The portable near-field antenna measurement system of claim 17, wherein said analyzer communicable with said computer to acquire, process, store, and visualize date from said probe.

19. The portable near-field antenna measurement system of claim 18, wherein said analyzer communicable with said computer via a router or a local area network.

20. The portable near-field antenna measurement system of claim 19, wherein a positioner control unit communicable with said azimuth positioner and said elevation positioner.

21. The portable near-field antenna measurement system of claim 20, wherein said anechoic chamber attached to a hardware rack, said analyzer, said computer, and said positioner control unit mounted to said hardware rack.

22. The portable near-field antenna measurement system of claim 20, wherein each said frequency converter communicable with said analyzer via a switch box and an amplifier.

23. The portable near-field antenna measurement system of claim 20, wherein said chamber includes a camera movable therein for use with connecting leads from a probe to a wafer antenna or a chip antenna.

\* \* \* \* \*